US012666937B2

(12) United States Patent
Kim et al.

(10) Patent No.: US 12,666,937 B2
(45) Date of Patent: Jun. 23, 2026

(54) SEMICONDUCTOR CELL ARCHITECTURE INCLUDING BACKSIDE POWER RAILS

(71) Applicant: SAMSUNG ELECTRONICS CO., LTD., Suwon-si (KR)

(72) Inventors: Jintae Kim, Clifton Park, NY (US); Panjae Park, Halfmoon, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 391 days.

(21) Appl. No.: 18/226,338

(22) Filed: Jul. 26, 2023

(65) Prior Publication Data

US 2024/0304520 A1  Sep. 12, 2024

Related U.S. Application Data

(60) Provisional application No. 63/450,580, filed on Mar. 7, 2023.

(51) Int. Cl.
*H10W 20/20* (2026.01)
*H10D 89/10* (2025.01)
*H10W 20/41* (2026.01)
(52) U.S. Cl.
CPC ................................... *H10W 20/20* (2026.01)
(58) Field of Classification Search
CPC ............... H10W 20/20; H10W 20/427; H10W 20/4403; H10W 20/435; H10D 89/10; H01L 23/481; H01L 23/5286; H01L 23/5283; H01L 23/53209
See application file for complete search history.

(56) References Cited

U.S. PATENT DOCUMENTS

| | | | |
|---|---|---|---|
| 7,989,849 B2 | 8/2011 | Sherlekar et al. | |
| 10,242,148 B2 | 3/2019 | Weng | |
| 11,011,545 B2 | 5/2021 | Guo et al. | |
| 2016/0086932 A1 | 3/2016 | Chen et al. | |
| 2020/0159984 A1 | 5/2020 | Do et al. | |
| 2020/0327274 A1 | 10/2020 | Chen et al. | |
| 2021/0125926 A1* | 4/2021 | Le Bars | H01L 23/5228 |
| 2021/0335774 A1 | 10/2021 | Ochiai | |
| 2022/0077134 A1 | 3/2022 | Chen et al. | |
| 2023/0063786 A1 | 3/2023 | Liao et al. | |

FOREIGN PATENT DOCUMENTS

TW 202310290 A 3/2023

* cited by examiner

*Primary Examiner* — Herve-Louis Y Assouman
(74) *Attorney, Agent, or Firm* — Myers Bigel, P.A.

(57) ABSTRACT

Provided is a semiconductor cell architecture which includes a plurality of cells, a plurality of backside power rails, and a plurality of metal lines, wherein the backside power rails are extended in a cell-length direction, and at least one backside power rail vertically overlaps an inside area of at least one cell without vertically overlapping a lower boundary or an upper boundary of the at least one cell in a plan view.

18 Claims, 4 Drawing Sheets

SEMICONDUCTOR CELL ARCHITECTURE INCLUDING BACKSIDE POWER RAILS

CROSS-REFERENCE TO RELATED APPLICATION

This application is based on and claims priority from U.S. Provisional Application No. 63/450,580 filed on Mar. 7, 2023 in the U.S. Patent and Trademark Office, the disclosure of which is incorporated herein in its entirety by reference.

BACKGROUND

1. Field

Apparatuses and methods consistent with example embodiments of the disclosure relate to a standard cell for a semiconductor device.

2. Description of Related Art

One or more semiconductor cells provided to implement a logic circuit in designing an integrated circuit have predetermined architectures and may be stored in a cell library. This semiconductor cell may be a standard cell, and may also be referred to as cell herein. The standard cell may include a plurality of active regions and gate structures forming one or more transistors configured to perform a logic function such as AND, OR, NOR, NAND, XOR, multiplexer, etc.

When designing an integrated circuit, one or more cells are retrieved from the cell library and placed into desired locations on an integrated circuit layout. Routing interconnects or metal lines (hereafter collectively "metal lines") are then performed for element connections in each cell and between the cells to form a semiconductor cell architecture for a semiconductor device. Each cell may have a predetermined size in terms of cell width, cell height, cell length, etc.

Device performance and design/manufacturing efficiency of an integrated circuit may be determined according to a configuration or layout of semiconductor cells and metal lines which connect active regions and gate structures forming one or more transistors in each cell to each other or to other circuit elements or power rails. For example, a long signal routing path formed by one or more metal lines may cause signal attenuation, delay or interference, increased IR drop, connection resistance and/or capacitance which degrade a device performance. Further, metal lines forming a long signal routing path makes design and manufacturing efforts difficult and complicated.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a semiconductor cell architecture in which a plurality of backside power rails are formed in a predetermined pitch.

According to embodiments, there is provided a semiconductor cell architecture which may include a plurality of cells, a plurality of backside power rails, and a plurality of metal lines, wherein the backside power rails are extended in a cell-length direction, and at least one backside power rail vertically overlaps an inside area of at least one cell without vertically overlapping a lower boundary or an upper boundary of the at least one cell in a plan view.

The at least one backside power rail may vertically overlap an upper boundary or a lower boundary of another at least one cell in the plan view.

According to embodiments, there is provided a semiconductor cell architecture which may include a plurality of cells, a plurality of backside power rails, and a plurality of metal lines, wherein the cells have an equal cell height, the backside power rails are extended in a cell-length direction, and at least two adjacent cells in the cell-length direction do not share a side boundary at a full cell length.

According to embodiments, there is provided a semiconductor cell architecture which may include a plurality of cells, a plurality of backside metal lines, and a plurality of metal lines, wherein the backside metal lines are extended in a cell-length direction, the metal lines include a plurality of $1^{st}$ metal lines extended in the-cell length direction in a $1^{st}$ metal layer and a plurality of $2^{nd}$ metal lines extended in a cell-height direction in a $2^{nd}$ metal layer, and the $1^{st}$ metal lines are placed in at least one row defined by two adjacent backside metal lines in a plan view.

BRIEF DESCRIPTION OF DRAWINGS

Example embodiments of the disclosure will be more clearly understood from the following detailed description taken in conjunction with the accompanying drawings in which.

DETAILED DESCRIPTION OF EMBODIMENTS

Figure 1:
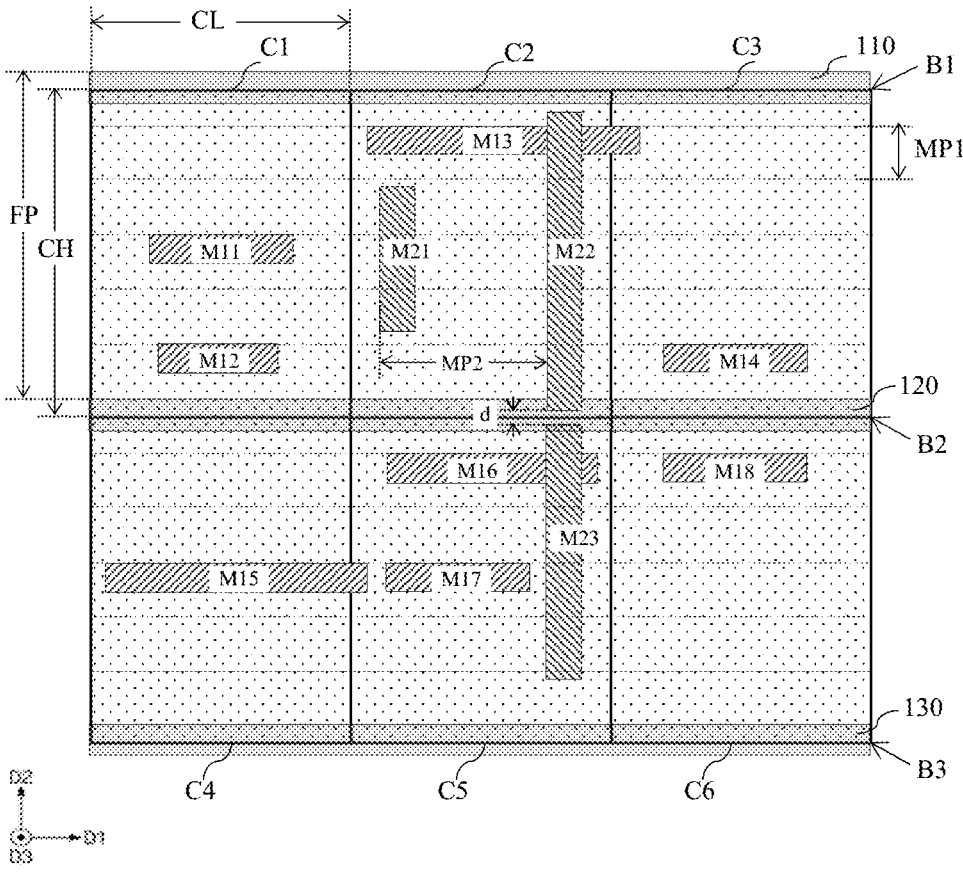
FIG. 1 is a plan view of a semiconductor cell architecture including a plurality of cells on which frontside power rails are formed, according to an embodiment.

The embodiments of the disclosure described herein are example embodiments, and thus, the disclosure is not limited thereto, and may be realized in various other forms. Each of the embodiments provided herein is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it is to be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof.

It is to be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the drawings. It is to be understood that the spatially relative terms are intended to encompass different orientations of a semiconductor device in use or operation in addition to the orientation depicted in the drawings. For example, if the semiconductor device in the drawings is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "lower" element and an "upper" element" may be an "upper" element and a "lower" element when a device or structure including these elements are differently oriented. Thus, in the descriptions herebelow, the "lower" element and the "upper" element may also be referred to as a "$1^{st}$" element or a "$2^{nd}$" element, respectively, as long as their structural relationship is clearly understood in the context of the descriptions. Similarly, the terms a "left" element and a "right" element may be respectively referred to as a "$1^{st}$" element and a "$2^{nd}$" element with necessary descriptions to distinguish the two elements.

It is to be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element described in one embodiment herein could be termed a $2^{nd}$ element in another embodiment or claims of the disclosure without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It is to be understood that various elements shown in the drawings are schematic illustrations not drawn to scale. In addition, for ease of explanation, one or more elements of a type commonly used to form semiconductor devices may not be explicitly shown in the drawings without implying these elements are omitted from actual semiconductor devices. Furthermore, it is to be understood that the embodiments described herein are not limited to particular materials, features, and manufacturing steps or operations shown or described herein. Thus, with respect to semiconductor manufacturing steps, the descriptions provided herein are not intended to include all steps that may be required to form an actual semiconductor device. For example, the commonly-used steps such as planarizing, cleaning, or annealing steps may not be described herein for the sake of brevity. It is to be also understood that, even if a certain step or operation is described later than another step or operation, the step or operation may be performed later than the other step or operation unless the other step or operation is described as being performed after the step or operation.

Many embodiments are described herein with reference to cross-sectional views that are schematic illustrations of the embodiments. As such, variations from the shapes of the illustrations as a result, for example, of manufacturing techniques and/or tolerances, are to be expected. Thus, the embodiments should not be construed as limited to the particular shapes of elements illustrated herein but are to include deviations in shapes that result, for example, from manufacturing. Various elements illustrated in the drawings are schematic in nature and their shapes are not intended to illustrate the actual shape of an element of a semiconductor device and are not intended to limit the scope of the disclosure. Moreover, conventional elements of a semiconductor device and their functions, materials and shapes may not be described when these elements are not related to the novel features of the embodiments or not necessary in describing the same.

Herebelow, various embodiments of the disclosure will be described in reference to FIGS. 1 to 4.

FIG. 1 is a plan view of a semiconductor cell architecture including a plurality of cells on which frontside power rails are formed, according to an embodiment.

Referring to FIG. 1, a semiconductor cell architecture 10 may include a plurality of cells C1, C2 and C3 arranged in a $1^{st}$ direction D1 at a $1^{st}$ row, and another plurality of cells C4, C5 and C6 arranged in the $1^{st}$ direction D1 at a $2^{nd}$ row. The $1^{st}$ direction D1 and the $2^{nd}$ direction D2 indicate a cell-length direction and a cell-height direction, respectively, and may horizontally intersect each other. Each of the cells CL1-CL6 may have a fixed cell length CL and a fixed cell height CH. Each of the cells C1-C6 may include one or more active regions and gate structures to form one or more transistors. The active regions may include source/drain regions and channel structures of one or more transistors formed in the semiconductor cell architecture 10.

The cells C1-C3 may have respective upper boundaries which are coplanar in the $1^{st}$ direction D1 to form a combined upper boundary B1 of the cells C1-C3. The cells C1-C3 may also have respective lower boundaries which are coplanar in the $1^{st}$ direction D1 to form a combined lower boundary B2 of the cells C1-C3. The lower boundary B2 of the cells C1-C3 may also be a combined upper boundary of the cells C4-C6. The cells C4-C6 may also have respective lower boundaries which are coplanar in the $1^{st}$ direction D1 to form a combined lower boundary B3 of the cells C4-C6.

According to embodiments, the boundaries B1-B3 and each cell boundary may be implemented by an isolation or insulation structure such as a shallow trench isolation (STI) structure, a gate cut structure, a fin cut structure, etc. which may be formed of a dielectric material such as silicon oxide or silicon nitride, not being limited thereto.

The semiconductor cell architecture 10 may include three power rails 110, 120 and 130 on a front side of the cells C1-C6. The power rail 110 may be placed on the combined upper boundary B1 of the cells C1-C3, and the power rail 120 may be placed on the combined lower boundary B2 of the cells C1-C3 which is also the combined upper boundary of the cells C4-C6. The power rail 130 may be placed on a combined lower boundary B3 of the cells C4-C6. These power rails 110-130 may vertically overlap the respective cell boundaries B1-B3 in a $3^{rd}$ direction D3 intersecting the $1^{st}$ and $2^{nd}$ directions D1 and D2. Thus, the power rails 110-130 may be arranged at a frontside power rail pitch FP in the $2^{nd}$ direction D2, which may be equal to the fixed cell height CH.

The power rails 110 and 130 may each provide a $1^{st}$ voltage to the semiconductor cell architecture 10, and the power rail 120 may provide a $2^{nd}$ voltage which is lower than the $1^{st}$ voltage to the semiconductor cell architecture 10. For example, the $2^{nd}$ voltage may be a ground voltage or a negative voltage.

Based on the positions of the power rails 110-130 at the boundaries B1-B3, a plurality of metal lines M11-M18 and a plurality of metal lines M21-M23 may be placed in the cells C1-C6 to connect the active regions and the gate structures to other circuit elements and the power rails 110-130, respectively. The metal line M11-M18 and the power rails 110-130 may be placed and extended in the $1^{st}$ direction D1 in a $1^{st}$ metal layer vertically above the active regions and the gate structures in the $3^{rd}$ direction D3. The metal lines M21-M23 may be placed and extended in the $2^{nd}$ direction D2 in a $2^{nd}$ metal layer vertically above the $1^{st}$ metal layer in the D3 direction. In a plan view as shown in FIG. 1, the power rails 110-130 and the metal lines M11-M18 may be arranged in the $2^{nd}$ direction D2 at a $1^{st}$ metal pitch MP1, and the metal lines M21-M23 may be arranged in the $1^{st}$ direction D1 at a $2^{nd}$ metal pitch MP2.

For example, when the semiconductor cell architecture 10 is designed to implement a flip-flop circuit, the metal line M13 may be placed in the cell C2 as an input node to receive an input signal for a master latch, and the metal line M14 may be placed in the cell C3 as an output node to receive an output signal of the master latch as an input signal of a slave latch. Further, the metal line M11 may be placed in the cell C1 as another output node to receive the output signal of the master latch as a feedback signal to the master latch.

Here, these metal lines M11, M13 and M14 may be placed in the respective cells C1, C2 and C3 based on the fixed size, arrangement and positions of the cells C1-C6 with respect to each other and the fixed positions of the power rails 110-130 at the respective boundaries B1, B2 and B3 in the semiconductor cell architecture 10. Thus, the placement positions of the metal lines M11, M13 and M14 may be very limited such that the output node metal lines M11 and M14 may be distant from the input node metal line M13, thereby forming a long signal routing path in the semiconductor cell architecture 10. For example, the output node metal lines M11 and M14 may be distant from the input node metal line M13 by two metal line pitches and four metal line pitches in the $2^{nd}$ direction D2. As described earlier, the long signal routing path formed by metal lines in a semiconductor cell architecture may result in manufacturing difficulties and a decreased device performance.

Further, as shown in FIG. 1, when the metal line M23 in the cell C5 may be an input node of an output inverter circuit of the flip-flop circuit, for example, a risk of short-circuit or signal interference may increase. This is because the metal line M23 configured to receive an output signal of the slave latch is placed to be too close to the metal line M22 configured to receive the input signal of the master latch. For example, a distance "d" between the two metal lines M22 and M23 may be far less than even one $1^{st}$ metal line pitch in the $2^{nd}$ direction D2.

Although FIG. 1 shows that the semiconductor cell architecture 10 includes three cells at each of the two lows with three power rails 110-130, 11 metal lines M11-M18 and M21-M23 at two metal layers, and three power rails 110-130. There may be more or less than three cells at each row, more or less than 11 metal lines at more or less than two metal layers, and more or less than three power rails may be formed in the semiconductor cell architecture 10.

In order to address the long signal routing path and signal interference in the semiconductor cell architecture 10 shown in FIG. 1, repositioning the cells C1-C6 may be considered.

Figure 2:
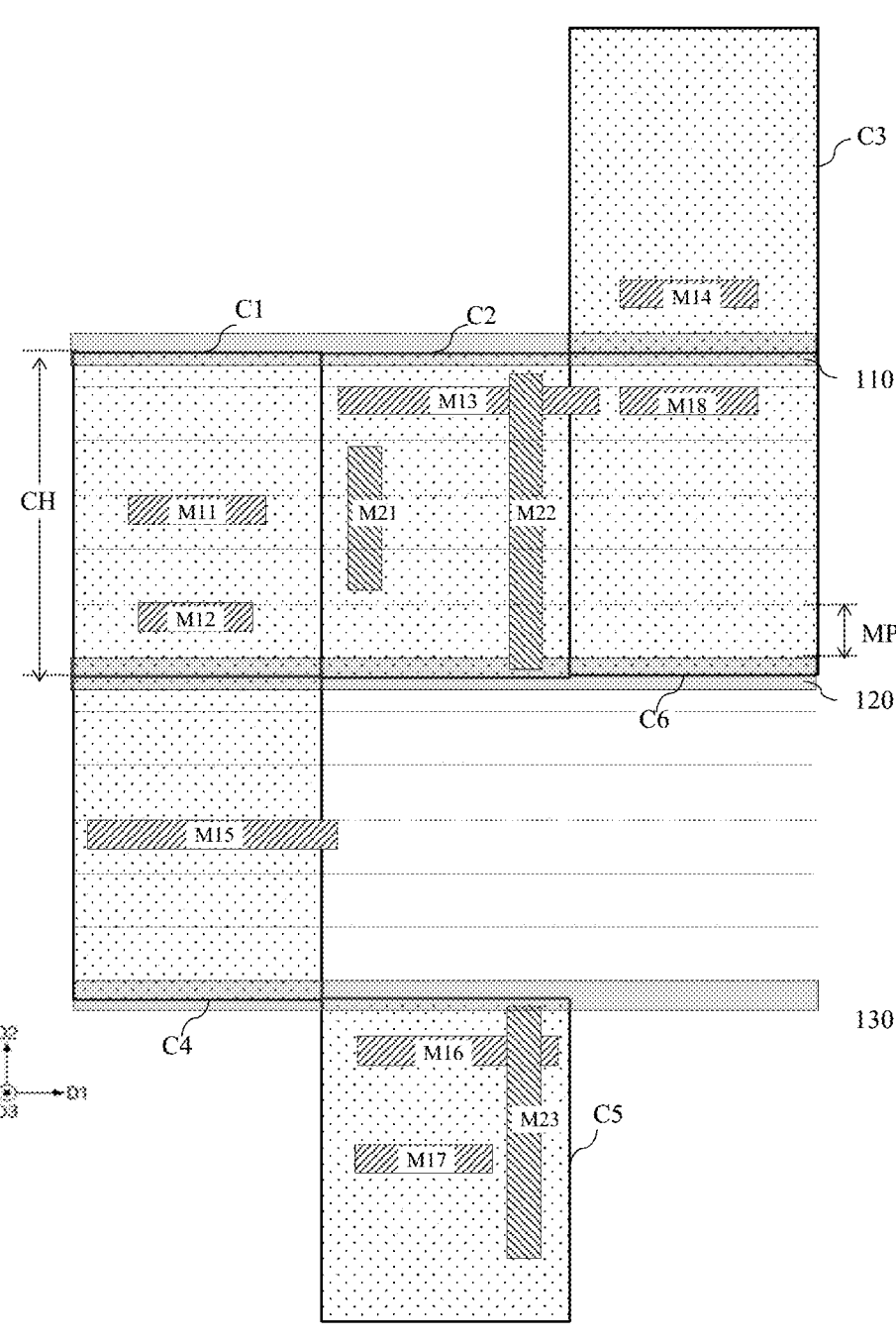
FIG. 2 is a plan view of a semiconductor cell architecture in which a plurality of cells in the semiconductor cell architecture of FIG. 1 are repositioned, according to an embodiment.

FIG. 2 is a plan view of a semiconductor cell architecture in which a plurality of cells in the semiconductor cell architecture of FIG. 1 are repositioned, according to an embodiment.

Referring to FIG. 2, a semiconductor cell architecture 20 may include the same cells C1-C6, power rails 110-130, and metal lines M11-M18 and M21-M23 as those included in the semiconductor cell architecture 10. Thus, duplicate descriptions thereof may be omitted.

According to an embodiment, however, the semiconductor cell architecture 20 may have a different arrangement of the cells C3, C5 and C6 compared to the semiconductor cell architecture 10 shown in FIG. 1.

The cells C3 and C6 adjacent to each other in the $2^{nd}$ direction D2 may be moved upward by one cell height, thereby to reduce the distance in the $2^{nd}$ direction D2 between the input node metal line M13 and the output node metal line M14 at least by two metal line pitches. Further, the cell C5 including the interfering metal line M23 may be moved downward by one cell height, thereby to remove or reduce the risk of short circuit and signal interference with respect to the metal line M22 in the cell C2.

However, as shown in FIG. 2, an entire footprint of the semiconductor cell architecture 10 may increase by at least two cell heights in the $2^{nd}$ direction D2. This is because the cell arrangement and placement of the metal lines on the front side of the semiconductor cell architecture 10 or 20 are dependent on the positions of the power rails 110, 120 and 130 fixed on the same front side of the semiconductor cell architecture 10 or 20 at the respective cell boundaries B1, B2 and B2 as well as the fixed cell length CL and the fixed cell height CH. Thus, each of the cells C1-C6 of the semiconductor cell architectures 10 and 20 cannot help but move at least by one or more cell heights when moving in the $2^{nd}$ direction D2.

Figure 3:
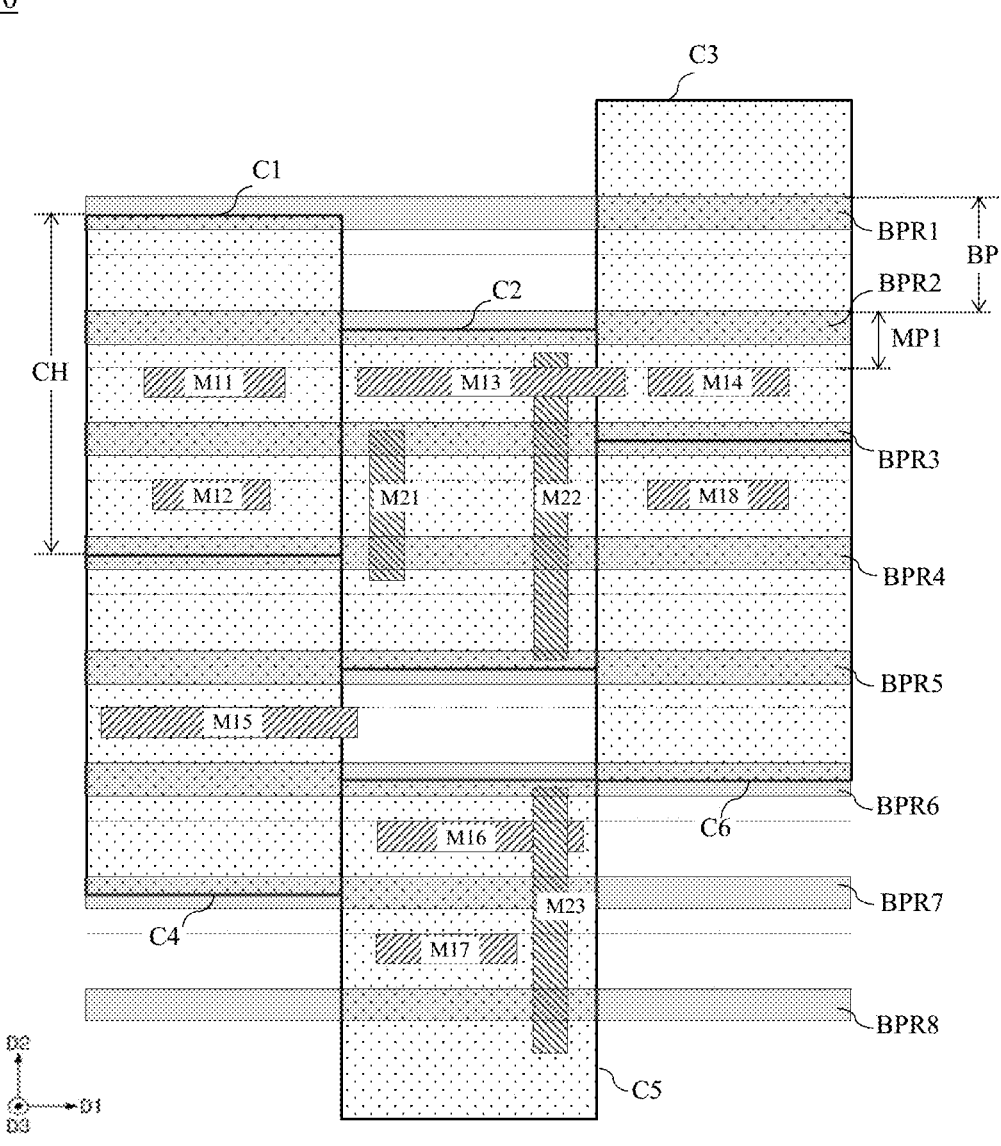
FIG. 3 is a plan view of a semiconductor cell architecture on which a BSPDN structure is formed, according to an embodiment.

Thus, in order to address the increased size of the semiconductor cell architecture 20 as well as the long signal routing path and signal inference in the semiconductor cell architecture 10, the following embodiment, as illustrated by example in FIG. 3, provides a semiconductor cell architecture in which placement of metal lines is flexibly adjusted based on a backside power distribution network (BSPDN).

A BSPDN structure is introduced to address a routing complexity at a front side of a semiconductor device during a back-end-of-line (BEOL) process of manufacturing the semiconductor device. The BSPDN structure may include, for example, a backside contact structure formed on a bottom surface of a source/drain region of a transistor and a backside metal line which may be a signal-path metal line or a power rail connecting the backside contact structure to a voltage source from the back side of the semiconductor device. The BSPDN structure may be formed in a substrate, on which the active regions and the gate structures are formed, or a backside isolation structure replacing at least a part of the substrate at the back side of the semiconductor device. As the BSPDN structure is formed at the back side of the semiconductor device, the semiconductor device may achieve an area gain, prevent an excessive IR drop at the front side thereof, and reduce manufacturing complexity at the front side thereof.

FIG. 3 is a plan view of a semiconductor cell architecture on which a BSPDN structure is formed, according to an embodiment.

Referring to FIG. 3, a semiconductor cell architecture 30 may include the same cells C1-C6 and metal lines M11-M18 and M21-M23 as those included in the semiconductor cell architecture 10. Thus, duplicate descriptions thereof may be omitted.

According to an embodiment, however, the semiconductor cell architecture 30 may include a plurality of backside power rails BPR1-BPR8 on a back side of the semiconductor cell architecture 30 instead of the frontside power rails 110-130 shown in FIGS. 1 and 2. According to an embodiment, the backside power rails BPR1-BPR8 may be extended in the $1^{st}$ direction D1 in parallel, and arranged in the $2^{nd}$ direction D2 at a backside power rail pitch BP, which may be smaller than the cell height CH and greater than the $1^{st}$ metal line pitch MP1 of the semiconductor cell architectures 10 and 20.

The backside power rail pitch BP may be also a backside metal line pitch because any one of the backside power rails BPR1-BPR8 may be replaced by a backside metal line which is not a power rail. When a backside metal line is formed at a position of any one of the backside power rails BPR1-BPR8, the backside metal line may not be as long as the backside power rail, and instead, may be sized to its connection purpose.

According to an embodiment, the backside power rails BPR1-BPR8 shown in FIG. 3 may all be backside metal lines, and selected ones of the backside metal lines may be used as backside power rails.

According to an embodiment, the backside power rail pitch BP may be an integer multiple of the $1^{st}$ metal line pitch MP1. For example, the backside power rail pitch BP may be twice the $1^{st}$ metal line pitch MP1 as shown in FIG. 3. However, the cell height CH and the $1^{st}$ metal line pitch MP1 in the semiconductor cell architecture 30 may be equal to those in the semiconductor cell architectures 10 and 20.

According to an embodiment, upper boundaries and lower boundaries of the cells C1-C6 of the semiconductor cell architecture 30 may not be coplanar in the $1^{st}$ direction D1, unlike those of the cells C1-C6 of the semiconductor cell architectures 10 and 20. Accordingly, the adjacent two cells C1 and C2 may not share a side boundary at its full length in the $2^{nd}$ direction D2 while their cell heights are equal to each other. As shown in FIG. 3, a right-side boundary of the cell C1 overlaps a left-side boundary by only two backside power rail pitches. This arrangement is possible because the cell height CH is greater than the BPR pitch, for example an integer multiple of the BPR pitch, compared to the embodiments of FIGS. 1 and 2, where the cell height CH is equal to the front-side power rail pitch.

Thus, according to an embodiment, positions of the backside power rails BPR1-BPR8 in the semiconductor cell architecture 30 may not be limited to the upper boundaries or the lower boundaries of the cells C1-C6. For example, the backside power rail BPR2 may traverse an inside area of each of cells C1 and C3 without vertically overlapping the upper boundaries or the upper or lower boundaries of these cells, while it may vertically overlap the upper boundary of the cell C2.

Still, however, each of a lower boundary and an upper boundary of each of the cells C1-C6 may overlap any of the backside power rails BPR1-BPR8, according to an embodiment.

Due to the freedom of power rail placement at the backside of the semiconductor cell architecture 30, a position of each of the cells C1-C6 may be more freely changed in the $2^{nd}$ direction, according to embodiments.

For example, as shown in FIG. 3, the cell C1 may be moved upward by two $1^{st}$ metal line pitches (for example, one BPR pitch) relative to the cell C2 to place the output node metal line M11 to be coplanar with the input node metal line M13 in the $1^{st}$ direction D1 so that these two metal lines may be close enough to reduce a length of a signal routing path. When the cell C1 is moved, the cell C4 vertically adjacent to the cell C1 may also be moved upward by two $1^{st}$ metal line pitches relative to the cell C2, according to an embodiment.

As another example, as shown in FIG. 3, the cell C3 may be moved upward by four $1^{st}$ metal line pitches relative to the cell C2, to place the output node metal line M14 to be coplanar with the input node metal line M13 in the $1^{st}$ direction D1 so that these two metal lines may also be close enough to reduce a length of a signal routing path. When the cell C3 is moved, the cell C6 vertically adjacent to the cell C1 may also be moved upward by four $1^{st}$ metal line pitches relative to the cell C2, according to an embodiment.

As still another example, as shown in FIG. 3, the cell C4 may be moved downward by two $1^{st}$ metal line pitches relative to the cell C2, to place the metal line M23 to be spaced apart from the metal line M22 so that signals transferred by these two metal lines may not interfere each other, and/or to reduce the shorting risk due to close proximity.

According to an embodiment, the backside power rails BPR1-BPR8 extended in the $1^{st}$ direction D1 may not vertically (in the $3^{rd}$ direction D3) overlap the metal lines M11-M18 also extended in the $1^{st}$ direction D1 in the $1^{st}$ metal layer in order to at least minimize signal interference therebetween and routing convenience at the back side of the semiconductor cell architecture 30 as the power rails 110-130 at the front side of the semiconductor cell architectures 10 and 20 do not overlap the metal lines M11-M18. For example, each of the metal lines M11-M18 may be placed in a row defined by two adjacent backside power rails. However, the disclosure is not limited thereto. According to embodiments, two or more metal lines spaced apart in the $2^{nd}$ direction D2 at the $1^{st}$ metal layer may be placed in a row defined by two adjacent backside power rails. Further, according to embodiments, one or more metal lines at the $1^{st}$ metal layer may vertically overlap one or more of the backside power rails in the semiconductor cell architecture 30. This vertical overlapping between the backside power rails and the metal lines at the $1^{st}$ metal layer extended in the same direction may be enabled because the backside power rails are formed at the back side of the active regions and the gate structures in the semiconductor cell architecture 30 while the metal lines are formed at the opposite front side of the active regions and the gate structures.

As the cell positions may be freely adjusted without being limited to the frontside power rails, the semiconductor cell architecture 30 may have a minimally increased footprint even when the length of the signal routing path is significantly reduced and a risk of short circuit or signal interference between adjacent metal lines is also reduced.

According to an embodiment, the backside power rails BPR1, BPR3, BPR5 and BPR7 may each provide the $1^{st}$ voltage, and the alternatingly arranged backside power rails BPR2, BPR4, BRP6 and BPR8 may each provide the $2^{nd}$ voltage which may be lower than the $1^{st}$ voltage. However, the disclosure is not limited thereto. Any of the two adjacent backside power rails may provide the same voltage to the semiconductor cell architecture 30 according to embodiments.

Although FIG. 3 shows that the semiconductor cell architecture 30 includes eight backside power rails, the disclosure is not limited thereto. There may be more or less than eight backside power rails formed in the semiconductor cell architecture 30, according to embodiments.

In the above embodiments, each of the backside power rails BPR1-BPR6 and the metal lines M11-M18 and M21-M23 may be formed of a metal or a metal compound including copper (Cu), aluminum (Al), tungsten (W), molybdenum (Mo), ruthenium (Ru), cobalt (Co), etc.

In the above embodiments, the transistor or transistor structures formed in the semiconductor cell architecture 30 may be a fin field-effect transistor (FinFET), a nanosheet transistor, or the like, not being limited thereto. The FinFET has one or more horizontally arranged vertical fin structures as a channel structure of which at least three surfaces are surrounded by a gate structure, and the nanosheet transistor structure is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, multi-bridge channel field-effect transistor (MBCFET).

Figure 4:
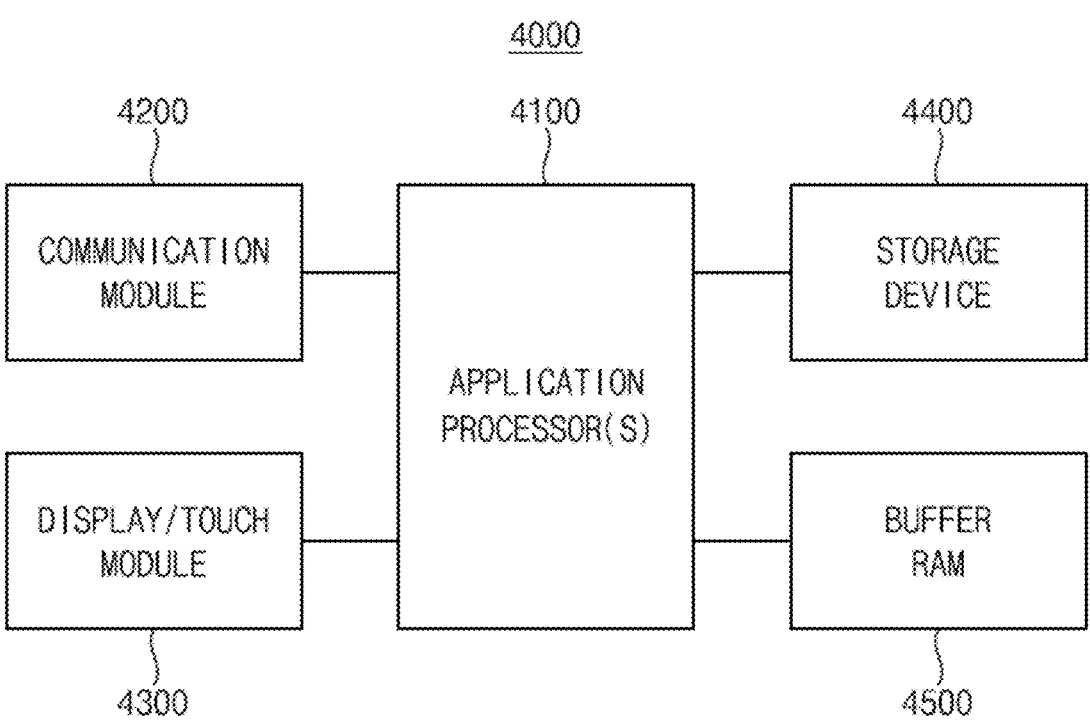
FIG. 4 is a schematic block diagram illustrating an electronic device manufactured based on the semiconductor cell architecture 30 or a portion thereof, as described above in reference to FIG. 3, according to an embodiment.

FIG. 4 is a schematic block diagram illustrating an electronic device manufactured based on the semiconductor cell architecture 30 or a portion thereof, as described above in reference to FIG. 3, according to an embodiment.

Referring to FIG. 4, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

The electronic device 4000 may further include at least one sensor such as an image sensor.

At least one component in the electronic device 4000 may be manufactured based on the semiconductor cell architecture 30 or a portion thereof described above in reference to FIG. 3.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A semiconductor cell architecture comprising a plurality of cells, a plurality of backside power rails, and a plurality of metal lines,
   wherein the backside power rails are extended in a cell-length direction,
   wherein at least one backside power rail vertically overlaps an inside area of at least one cell without vertically overlapping a lower boundary or an upper boundary of the at least one cell in a plan view; and
   wherein the at least one backside power rail vertically overlaps an upper boundary or a lower boundary of another at least one cell in the plan view.

2. The semiconductor cell architecture of claim 1, wherein the other at least one cell is adjacent to the at least one cell in the cell-length direction.

3. The semiconductor cell architecture of claim 1, wherein each of an upper boundary and a lower boundary of each cell vertically overlaps a respective backside power rail among the backside power rails in the plan view.

4. The semiconductor cell architecture of claim 3, wherein the cells have an equal cell height.

5. The semiconductor cell architecture of claim 4, wherein at least two adjacent cells in the cell-length direction do not share a side boundary at a full cell length.

6. The semiconductor cell architecture of claim 1, wherein a backside power rail positioned between two power rails in a cell-height direction provide a voltage different from voltages provided by the two power rails.

7. The semiconductor cell architecture of claim 1, wherein at least one of the backside power rails is configured to connect a corresponding cell to another circuit element which is not a voltage source.

8. The semiconductor cell architecture of claim 1, wherein the backside power rails are extended in the cell-length direction,
   wherein the plurality of metal lines comprise a plurality of 1st metal lines extended in the-cell-length direction in a $1^{st}$ metal layer and a plurality of $2^{nd}$ metal lines extended in a cell-height direction in a $2^{nd}$ metal layer, and
   wherein the 1st metal lines are placed in at least one row defined by two adjacent backside power rails in the plan view.

9. The semiconductor cell architecture of claim 8, wherein a pitch of the backside power rails is greater than a pitch of the 1st metal lines.

10. A semiconductor cell architecture comprising a plurality of cells, a plurality of backside power rails, and a plurality of metal lines,
   wherein the cells have an equal cell height,
   wherein the backside power rails are extended in a cell-length direction, and
   wherein at least two adjacent cells in the cell-length direction do not share a side boundary at a full cell length.

11. The semiconductor cell architecture of claim 10, wherein at least one backside power rail traverses an inside of at least one cell in a plan view.

12. The semiconductor cell architecture of claim 11, wherein the at least one backside power rail vertically overlaps an upper boundary or a lower boundary of another at least one cell in the plan view.

13. The semiconductor cell architecture of claim 12, wherein each of an upper boundary and a lower boundary of each cell vertically overlaps a respective backside power rail among the backside power rails in the plan view.

14. The semiconductor cell architecture of claim 13, wherein the metal lines comprise 1st metal lines extended in a cell-length direction and $2^{nd}$ metal lines extended in a cell-height direction, and wherein the $1^{st}$ metal lines do not vertically overlap the backside power rails in the plan view.

15. A semiconductor cell architecture comprising a plurality of cells, a plurality of backside metal lines, and a plurality of metal lines, wherein the backside metal lines are extended in a cell-length direction, wherein the metal lines comprise a plurality of $1^{st}$ metal lines extended in the-cell length direction in a $1^{st}$ metal layer and a plurality of $2^{nd}$ metal lines extended in a cell-height direction in a $2^{nd}$ metal layer, wherein the $1^{st}$ metal lines are placed in at least one row defined by two adjacent backside metal lines in a plan view; and wherein a pitch of the backside metal lines is greater than a pitch of the $1^{st}$ metal lines.

16. The semiconductor cell architecture of claim 15, wherein at least two backside metal lines are backside power rails.

17. The semiconductor cell architecture of claim 15, wherein at least one backside metal line vertically overlaps an inside area of at least one cell without vertically overlapping a lower boundary or an upper boundary of the at least one cell.

18. The semiconductor cell architecture of claim 17, wherein each of an upper boundary and a lower boundary of each cell vertically overlaps a respective backside power rail among the backside power rails in the plan view.

\* \* \* \* \*